(12) United States Patent
Ohta

(10) Patent No.: US 6,322,597 B1
(45) Date of Patent: Nov. 27, 2001

(54) SEMICONDUCTOR FABRICATION LINE WITH CONTAMINATION PREVENTING FUNCTION

(75) Inventor: Nahomi Ohta, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/281,283

(22) Filed: Mar. 30, 1999

(30) Foreign Application Priority Data

Mar. 31, 1998 (JP) .................................................. 10-086199

(51) Int. Cl.⁷ .................................................. H01L 21/00
(52) U.S. Cl. ............................................ 29/25.01; 438/14
(58) Field of Search .................... 438/971, 14; 414/217, 414/222; 454/187; 29/25.01

(56) References Cited

U.S. PATENT DOCUMENTS

| | | | |
|---|---|---|---|
| 4,433,951 | 2/1984 | Koch | 414/217 |
| 4,461,690 | 7/1984 | Rolff | 204/228.1 |
| 5,344,365 | 9/1994 | Scott | 454/187 |
| 5,366,670 | 11/1994 | Giner | 205/83 |
| 5,605,615 | 2/1997 | Goolsby | 205/83 |
| 5,629,838 | 5/1997 | Knight | 361/782 |
| 5,638,103 | 6/1997 | Obata | 347/164 |
| 5,932,139 | 8/1999 | Oshima | 252/301.16 |
| 6,051,286 | 4/2000 | Zhao | 427/576 |
| 6,149,780 | 11/2000 | Miyake | 204/228.1 |

FOREIGN PATENT DOCUMENTS 9-92704   4/1997   (JP).

OTHER PUBLICATIONS

Korean Office Action dated Dec. 20, 2000, with partial English Translation.

Primary Examiner—Jey Tsai
Assistant Examiner—Andre Stevenson
(74) Attorney, Agent, or Firm—McGinn & Gibb, PLLC

(57) ABSTRACT

A semiconductor fabrication line for fabricating a semiconductor device, which has: a mainstream line for conducting a semiconductor fabrication process to fabricate the semiconductor device; and an isolation line disposed separated from the mainstream line in the semiconductor fabrication line. The isolation line is provided for, of the semiconductor fabrication process, a contamination-including semiconductor fabrication process that a contamination causing material which may cause a contamination of the mainstream line appears on the surface of a wafer, and after processing the contamination causing material to be eliminated from the surface of the wafer in the isolation line, the wafer is returned from the isolation line to the mainstream line.

20 Claims, 12 Drawing Sheets

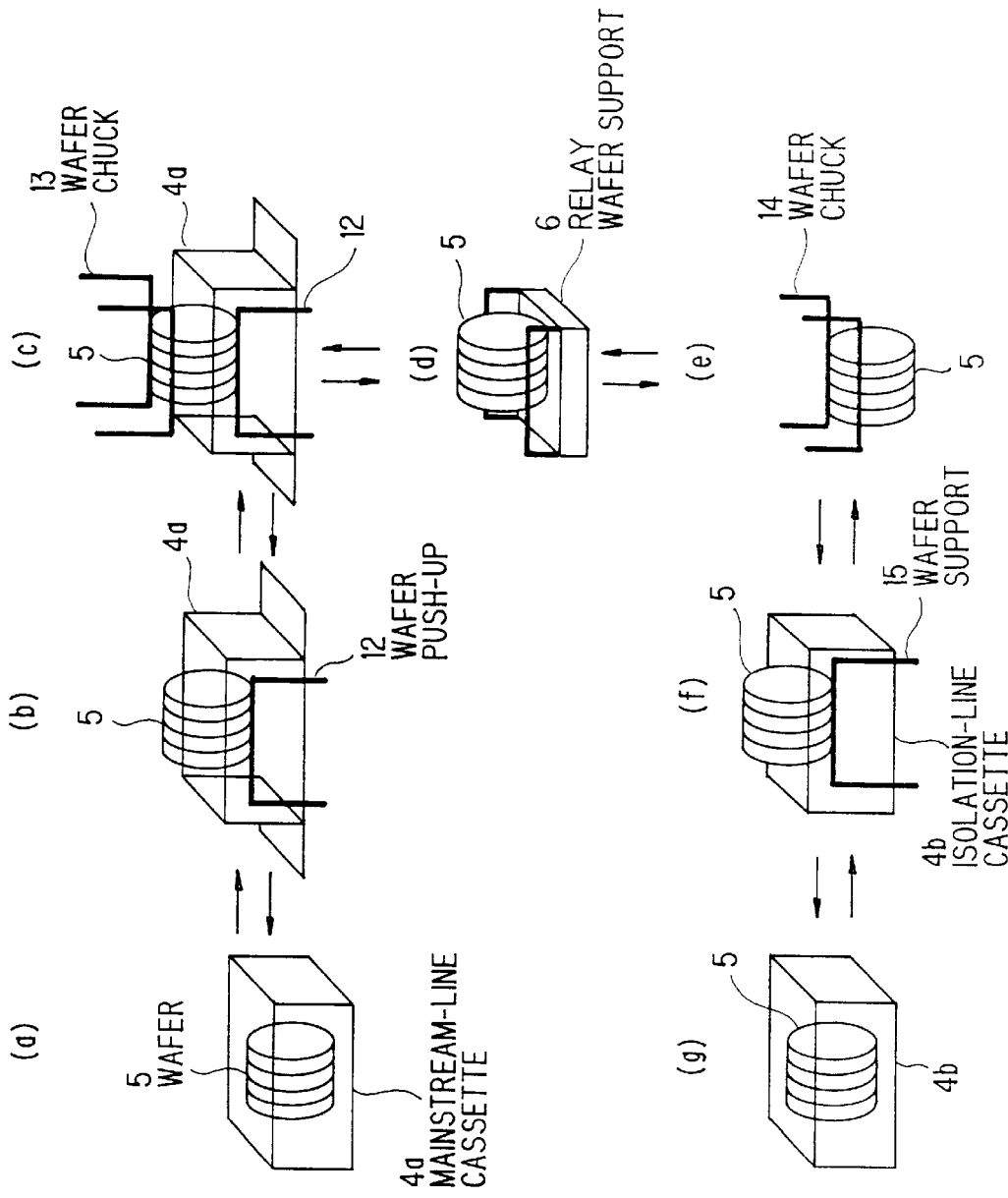

SEMICONDUCTOR FABRICATION LINE WITH CONTAMINATION PREVENTING FUNCTION

FIELD OF THE INVENTION

This invention relates to a semiconductor fabrication line and, more particularly, to a semiconductor fabrication line with a contamination preventing function.

BACKGROUND OF THE INVENTION

Conventional semiconductor fabrication lines are classified into an equipment concentration layout type (job shop) that same equipment is in common use for a same process thereby reducing the number of equipments, and an equipment distribution layout type (flow shop) that equipments are disposed in the order of fabrication process of semiconductor and separately provided even for a same process.

FIG. 1 shows an example of the equipment concentration layout type of fabrication line. As shown, this equipment concentration layout type has the processes of lithography, film forming 1, film forming 2, ion implantation, CVD, diffusion, cleaning and dry etch. Equipment for a material that may cause contamination is indicated hatched, equipment for another material that may cause contamination is indicated blacked, and part that common equipment is available is indicated 'common'. Namely, the lithography process and the ion implantation process are in common use. In this equipment concentration layout type, a bay for a same kind of process where equipment is disposed is formed and a wafer is transported between bays using a common carrier, i.e., a cassette and a carrying mechanism. Therefore, it is apt to incur a cross-contamination.

FIG. 2 shows an example of the equipment distribution layout type of fabrication line. Equipment for a material that may cause contamination is indicated hatched. This equipment distribution layout type has the processes of base 1, base 2, gate, gate wiring, diffusion region, interlayer film, contact, interlayer film, capacitor, interlayer film, wiring, interlayer film, wiring and upper part. In this equipment distribution layout type, a bay is formed for each process unit and equipments are disposed nearly in the order of process. Therefore, though it does not incur such cross-contamination that the equipment concentration layout type does, the number of equipments increases so much.

In any fabrication lines described above, it is important to prevent contamination in the process of fabricating a semiconductor. Conventional preventions against contamination are as follows.

When film-forming/processing equipment for contamination causing material is disposed in the semiconductor fabrication line as shown in FIGS. 1 and 2, the situation of contamination occurrence is monitored inside and outside the film-forming/processing equipment for contamination causing material. If a contamination occurs, a prevention against contamination, e.g., alteration of equipment and carrying mechanism and addition of contamination removal process, is taken (first prior art).

Also, when film-forming/processing equipment for contamination causing material is disposed in the semiconductor fabrication line, a contamination (Al, Cu etc.) from the wiring process in the later processes of semiconductor fabrication has been, thus far, mainly considered. However, there is a probability that a contamination caused by a contamination causing material occurs even in the earlier processes such that various silicides are used for gate wiring.

In such a case, in order to maintain a low level of contamination, a method of separating the line into several stages in the process of fabrication is taken (second prior art). FIG. 3 shows an example that the semiconductor fabrication process is separated into two lines, a line before the wiring process (front-end line) and a line after the wiring process (back-end line). Thus, depending on the semiconductor fabrication process, different lines may be provided for before and after the wiring process, so as to avoid the wiring material to contaminate the pre-wiring process.

In the semiconductor fabrication lines describes above, a wafer is transported between bays or equipments. This is conducted carrying the wafer on a carrier (cassette). FIG. 4 shows an example of conventional method of using a carrier in semiconductor fabrication equipment. In this method of using a carrier, after wafers 55 coming loaded on a cassette 54 are unloaded from the wafer unloading side of equipment 50, then the cassette 54 is moved to the wafer loading side and is set there. After completing the process, the wafers 55 are loaded on the selfsame cassette 54, then forwarded to the next process. Also, while the wafers 55 are processed through the processing, the cassette 54 may be cleaned and then set to the loading side.

In the conventional method of preventing contamination in the first prior art, the equipment for film-forming/processing the contamination causing material exists in the line. Therefore, it is impossible to reduce to zero the probability that the contaminator adheres to any part (front and rear surfaces of wafer, carrier, carrying mechanism etc.) thereby causing a line-contamination, namely, the risk of contamination occurrence is always underlying. Also, since it is necessary to monitor always the contamination inside and outside specific equipment, there is a problem that the contamination control is complicated.

In the conventional method of preventing contamination in the second prior art, to maintain a low level of contamination, it is necessary to separate the line into much more stages in the process of fabrication process. Namely, in the case of two-stage separation in FIG. 3, in the latter-half line, various contaminators are likely to mix therefore causing an increase in contamination level of the lines. Furthermore, when separating the line into stages more than two, there is a problem that equipment such as lithography needs to be provided for each line thereby increasing the equipment cost of line.

Also, in the conventional method of using a carrier, when a contamination causing material adheres to the cassette, the contamination from the cassette to the wafer occurs. Even when the cassette is cleaned during the process, unless the different cassettes are used separately for a process that a contamination causing material appears and a process that no contamination causing material appears, it is impossible to eliminate the possibility of the contaminator to transfer through the cassette. Also, even for the cassette cleaning, it is difficult to clean the cassette in all processes.

Thus, in the above prior arts, the separation/isolation of the process for film-forming/processing the contamination causing material is not conducted sufficiently.

SUMMARY OF THE INVENTION

Accordingly, it is in an object of the invention to provide a semiconductor fabrication line that a contamination causing material can be eliminated perfectly.

It is a further object of the invention to provide a wafer transfer mechanism that can transfer a wafer preventing a contamination causing material.

According to the invention, a semiconductor fabrication line for fabricating a semiconductor device, comprises:

a mainstream line for conducting a semiconductor fabrication process to fabricate the semiconductor device; and an isolation line disposed separated from the mainstream line in the semiconductor fabrication line;

wherein the isolation line is provided for, of the semiconductor fabrication process, a contamination-including semiconductor fabrication process that a contamination causing material which may cause a contamination of the mainstream line appears on the surface of a wafer, and after processing the contamination causing material to be eliminated from the surface of the wafer in the isolation line, the wafer is returned from the isolation line to the mainstream line.

According to another aspect of the invention, a wafer transfer mechanism for carrying a wafer in a semiconductor fabrication process, comprises:

a before-processing cassette that is used before processing the wafer; and an after-processing cassette that is used after processing the wafer.

BRIEF DESCRIPTION OF THE DRAWINGS

The invention will be explained in more detail in conjunction with the appended drawings, wherein:

FIG. 10 is an illustration showing the details of a wafer transferring mechanism using a relay wafer support in the first embodiment.

DESCRIPTION OF THE PREFERRED EMBODIMENTS

Figure 1:
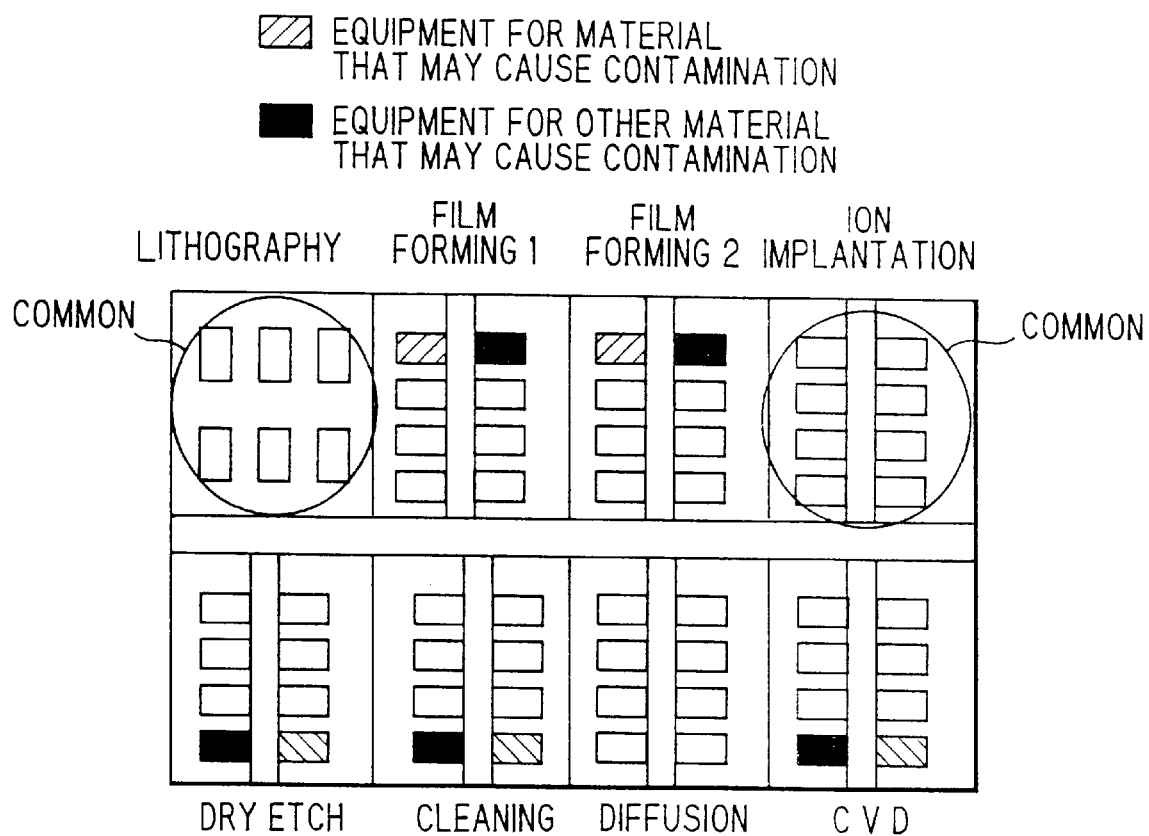
FIG. 1 is an illustration showing the conventional semiconductor fabrication line.
Figure 2:
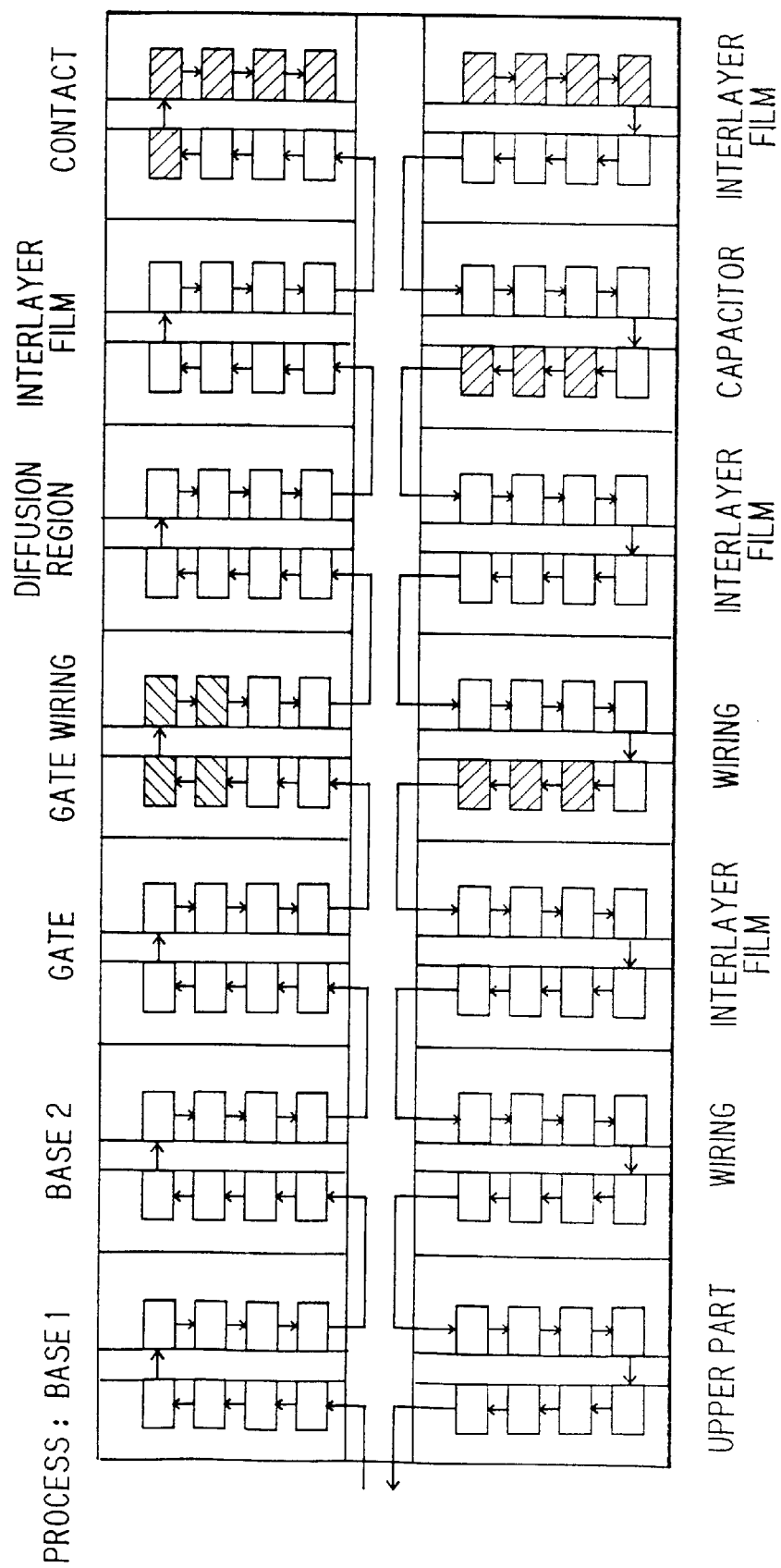
FIG. 2 is an illustration showing the other conventional semiconductor fabrication line.
Figure 3:
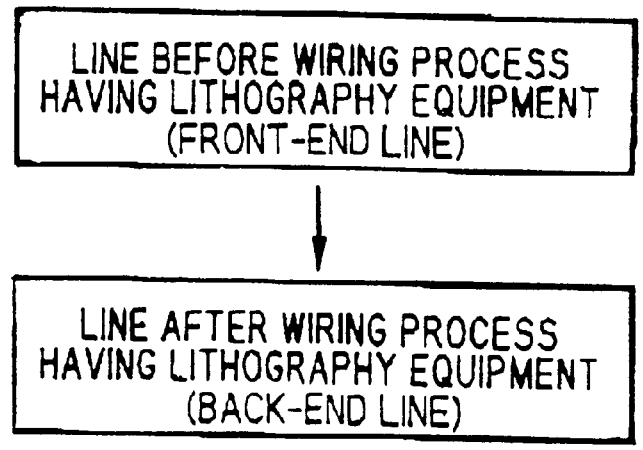
FIG. 3 is an illustration showing the conventional method for preventing a contamination in semiconductor fabrication line.
Figure 4:
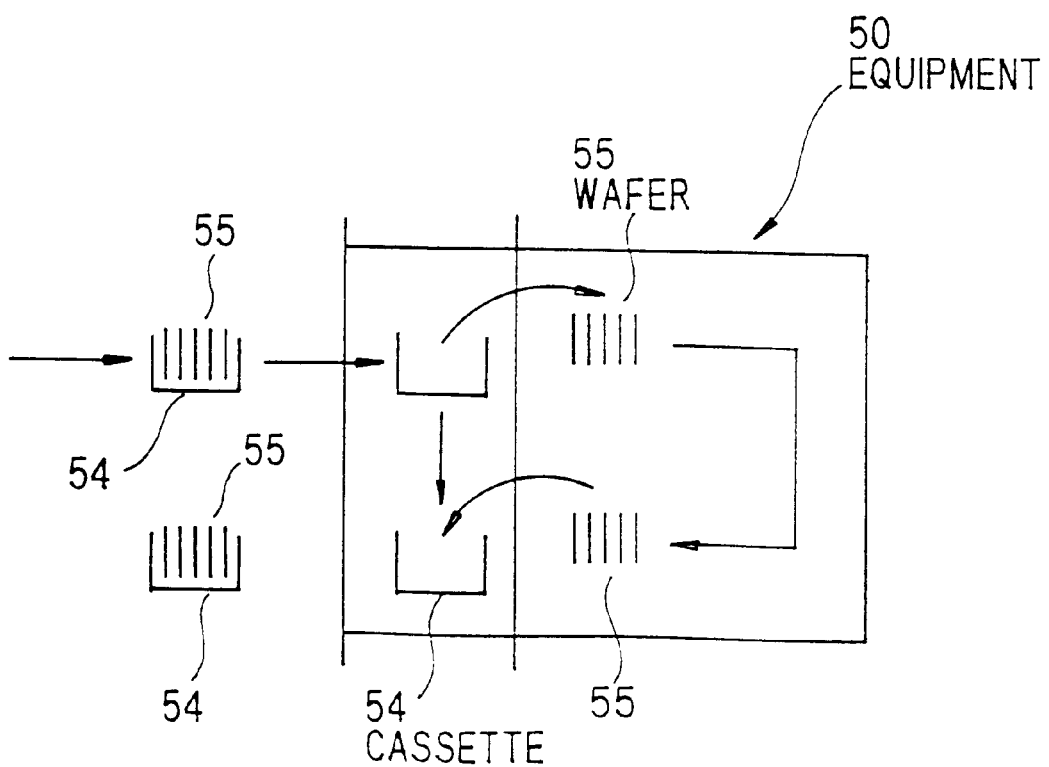
FIG. 4 is an illustration showing the conventional method of carrying a wafer in semiconductor fabrication line.

The preferred embodiments according to the invention will be explained below, referring to the drawings.

Figure 5:
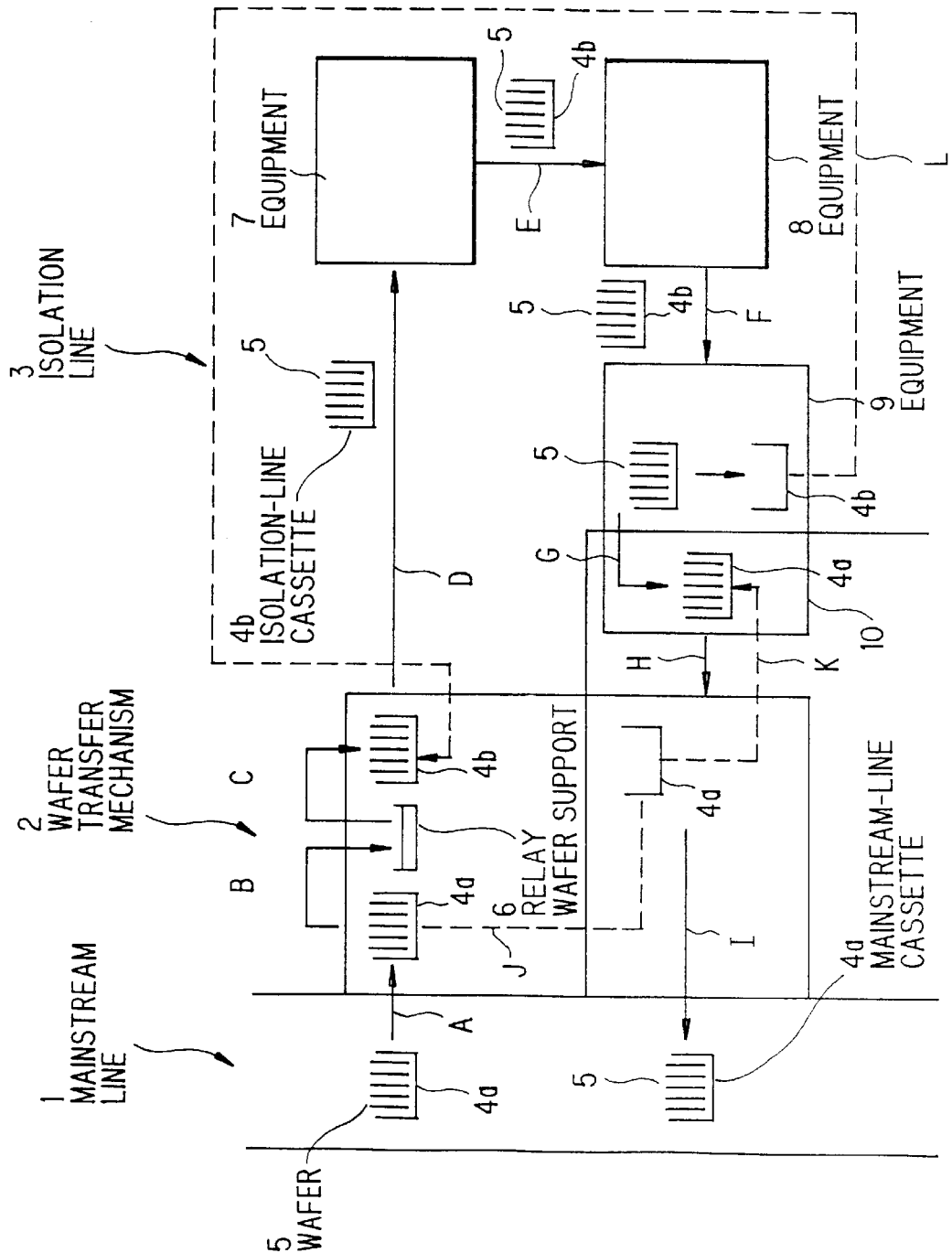
FIG. 5 is an illustration showing a semiconductor fabrication line in a first preferred embodiment according to the invention.

FIG. 5 is an illustration showing a semiconductor fabrication line in the first preferred embodiment according to the invention. This line is composed of a mainstream line 1 to conduct a normal semiconductor fabrication process, an isolation line 3, which is isolated from the mainstream line 1, to conduct a semiconductor fabrication process for contamination causing material, and a wafer transferring mechanism 2 to transfer wafers 5 between the mainstream line 1 and isolation line 3. In this embodiment, taken is a case that the number of contamination causing material is one and the number of the isolation line 3 is also one. As a cassette to carry the wafers 5, a mainstream-line cassette 4a and an isolation-line cassette 4b are provided. Also, in order to prevent the cassette from contaminating the wafers 5, a relay wafer support 6 may be used to transfer the cassette from the mainstream-line cassette 4a to the isolation-line cassette 4b. The wafers 5 transferred into the isolation line 3 are processed in equipments 7, 8 and 9 that are disposed in the isolation line 3. While the equipments 7, 8 are to conduct an individual-processing using a material, the equipment 9 is to conduct a final-stage processing in the isolation line 3 and is common equipment that wafers processed through the individual processing are processed together. Also, a wafer transfer common part 10 is a common part that the wafers 5 processed in the equipment 9 are transferred.

Referring to FIG. 5, the flow of wafer and cassette in this embodiment is explained below. Codes A to I indicate directions that the wafer and cassette are transferred. First, in the mainstream line 1, the mainstream-line cassette 4a and the wafers 5 loaded on the mainstream-line cassette 4a are transferred together to the wafer transferring mechanism 2 in direction A. In the wafer transferring mechanism 2, after separating the mainstream-line cassette 4a and the wafers 5, the wafers 5 are transferred to the relay wafer support 6 in direction B, further transferred from the relay wafer support 6 to the isolation-line cassette 4b set in advance in direction C. The wafers 5 transferred to the isolation-line cassette 4b are transferred to the equipment 7 in direction D, processed therein, further transferred to the equipment 8 in direction E, processed therein. The equipments 7, 8 are individual-processing equipments using the contamination causing material. The wafers 5 processed in the equipment 8 are transferred to the equipment 9 in direction F, processed through a common processing such as film-forming and cleaning in the equipment 9. After completing the final process in the equipment 9, the isolation-line cassette 4b and the wafers 5 are separated. The wafers 5 separated are transferred to the wafer transfer common part 10 in direction G, loaded on the mainstream-line cassette 4a set moving in directions J, K. Then, they are moved to the wafer transferring mechanism 2 in direction H, returned to the mainstream line 1 in direction I.

On the other hand, the isolation-line cassette 4b separated after completing the final process in the equipment 9 is moved to the wafer transferring mechanism 2 in direction L, set there to load a next wafer.

Figure 6:
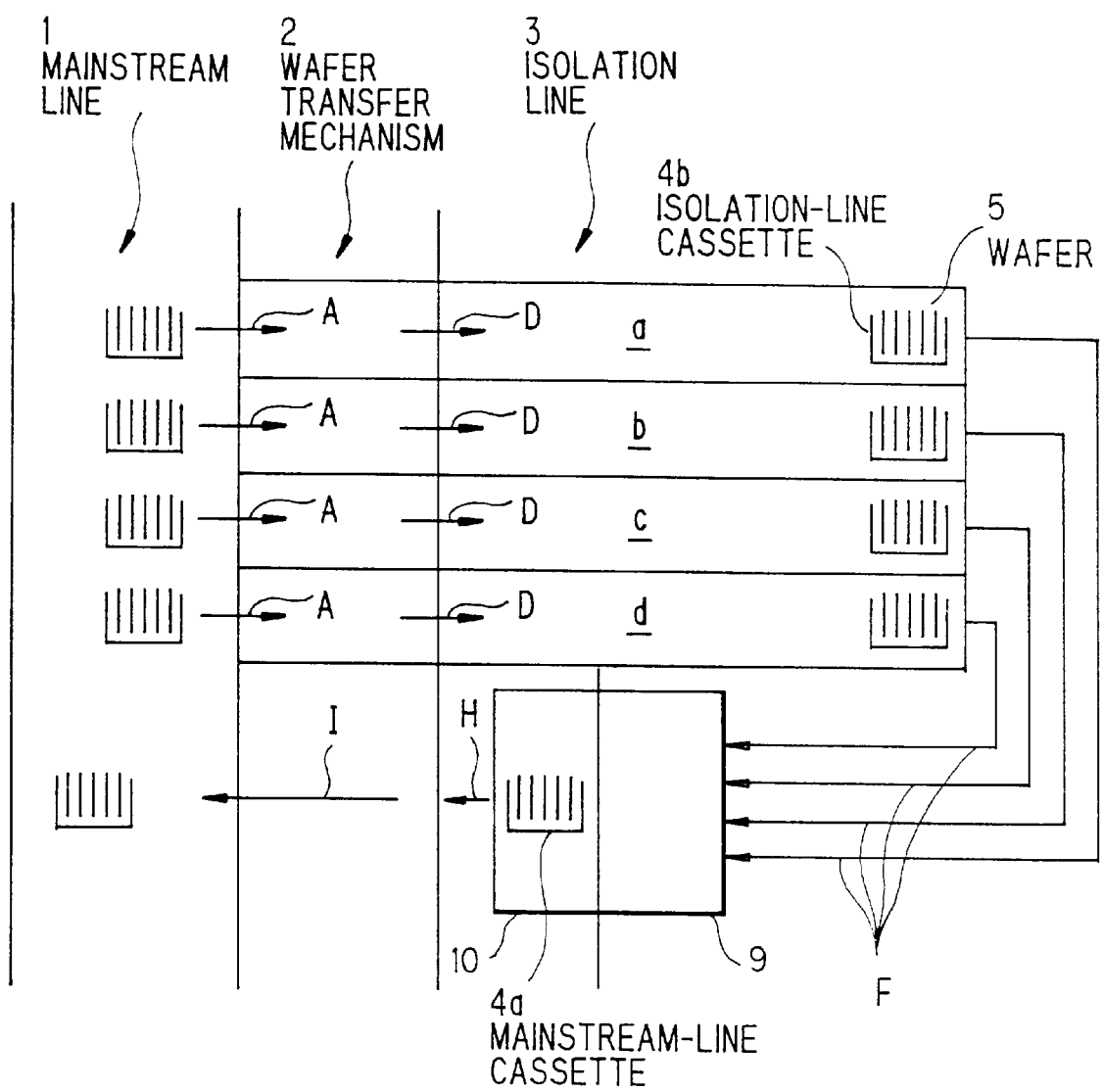
FIG. 6 is an illustration showing a semiconductor fabrication line in a second preferred embodiment according to the invention.

FIG. 6 is an illustration showing a semiconductor fabrication line in the second preferred embodiment according to the invention. This line is provided as a case that the number of contamination causing material is multiple and therefore multiple individual lines using the contamination causing materials are provided in the isolation line 3. The wafers 5 and the mainstream-line cassette 4a in the mainstream line 1 are transferred to the wafer transferring mechanism 2 in direction A. After separating the wafers 5 and the mainstream-line cassette 4a by the wafer transferring mechanism 2, the wafers 5 are loaded on the isolation-line cassette 4b, transferred to the isolation line 3 in direction D, processed through the individual processing using the contamination causing material in each of the individual lines a–d in the isolation line 3, transferred to the equipment 9 in direction F, processed through the common processing therein. After completing the common processing, separating the wafers 5 and the isolation-line cassette 4b, the wafers 5 are transferred to the wafer transfer common part 10, loaded on the mechanism-line cassette 4a set in advance. Then, the wafers 5 and the mainstream-line cassette 4a are moved to the wafer transferring mechanism 2 in direction H, further returned to the mainstream line 1 in direction I.

As explained above referring to FIGS. 5 and 6, in this invention, the isolation line 3 is provided in the semiconductor fabrication line, and the process to film-form or process a line-contamination causing material, e.g., Co, Pt, Ir etc., is conducted in the isolation line 3 separated from the mainstream line 1. After the contamination causing material is eliminated from the surface of wafer by covering the contamination causing material on wafer with film or by cleaning it at the final stage of the processes in the isolation line 3, the wafers 5 are returned to the mainstream line 1. Here, the isolation line 3 may be single as shown in FIG. 5 or have the individual lines a–d for the respective contamination causing materials. In the latter case, it should be noted that the wafers 5 are used within only each of the individual lines a–d and are not taken outside.

Figure 7:
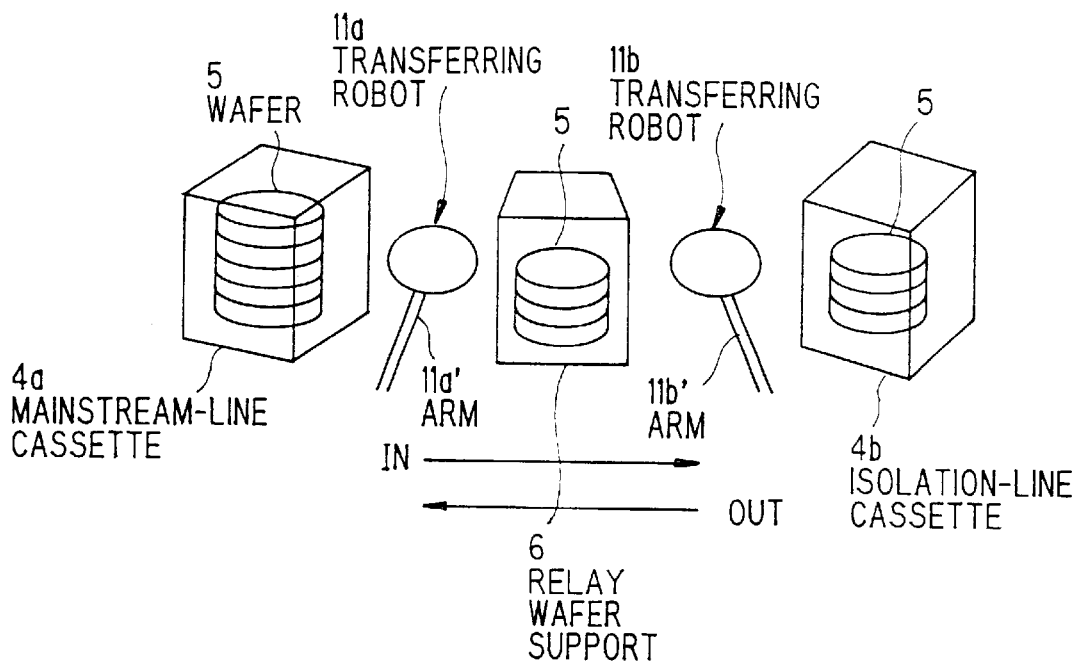
FIG. 7 is an illustration showing a wafer transfer mechanism in a first preferred embodiment according to the invention.

FIG. 7 is a perspective view showing a wafer transferring mechanism in the first preferred embodiment. As the wafer transferring mechanism 2, a transferring robot 11a is used to transfer the wafers 5 from the mainstream-line cassette 4a to the relay wafer support 6, and a transferring robot 11b is used to transfer the wafers 5 from the relay wafer support 6 to the isolation-line cassette 4b. The transferring robots 11a, 11b are provided with arms 11a′ and 11b′, respectively, and by moving to right and left the arms 11a′ and 11b′, the wafers 5 are transferred. As the handling method for them, known techniques are used to operate the transferring robots 11a, 11b with the arms 11a′, 11b′. Here, the transferring robots 11a, 11b, which conduct the transporting between the mainstream line 1 and the isolation line 3, themselves may incur a contamination. This can be a contamination caused by particles etc. attaching to them. In this case, it is necessary to clean occasionally the transferring robots 11a, 11b themselves. IN and OUT of wafer to the isolation line 3 are indicated by arrows in FIG. 7. Namely, in this embodiment, the IN side incoming to the isolation line 3 is placed at the same side as the OUT side outgoing from the isolation line 3.

Figure 8:
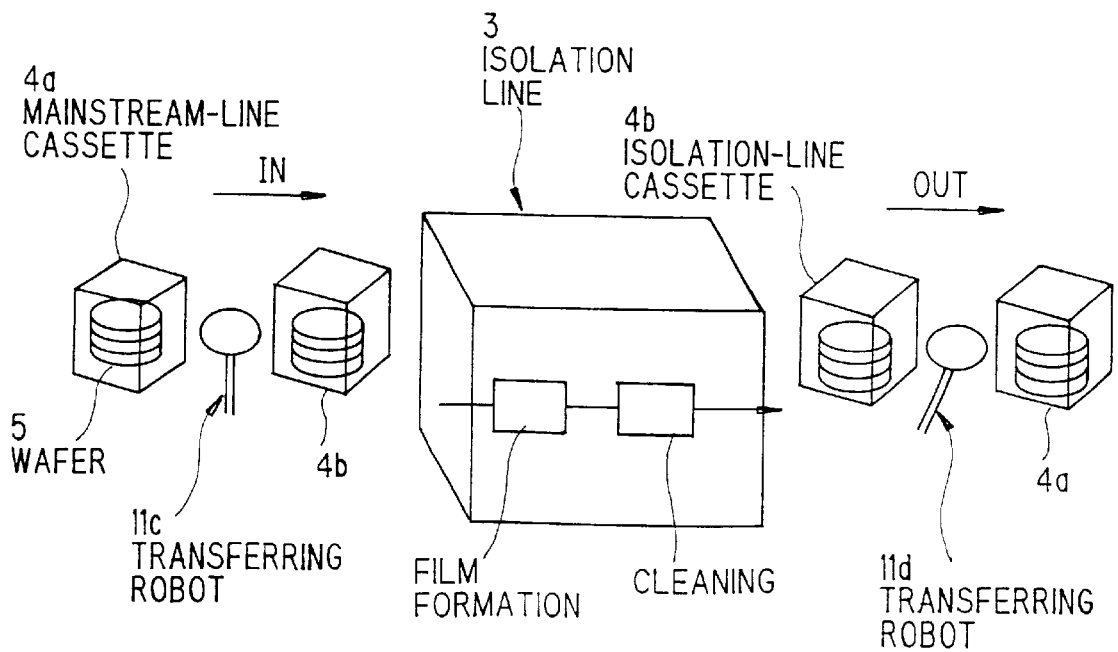
FIG. 8 is an illustration showing a wafer transfer mechanism in a second preferred embodiment according to the invention.

FIG. 8 is a perspective view showing a wafer transferring mechanism in the second preferred embodiment. As the wafer transferring mechanism 2, transferring robots 11c and 11d are used. First, using the transferring robot 11c, the wafers 5 are transferred from the mainstream-line cassette 4a to the isolation-line cassette 4b, processed through the film-forming and cleaning in the isolation line 3. Then, using the transferring robot 11d, the wafers 5 are transferred from the isolation-line cassette 4b to the mainstream-line cassette 4a. The isolation-line cassette 4b may be omitted, because the wafer is cleaned at the final stage of the isolation line 3. Namely, the IN side incoming to the isolation line 3 is placed at the opposite side of the OUT side outgoing from the isolation line 3.

Figure 9:
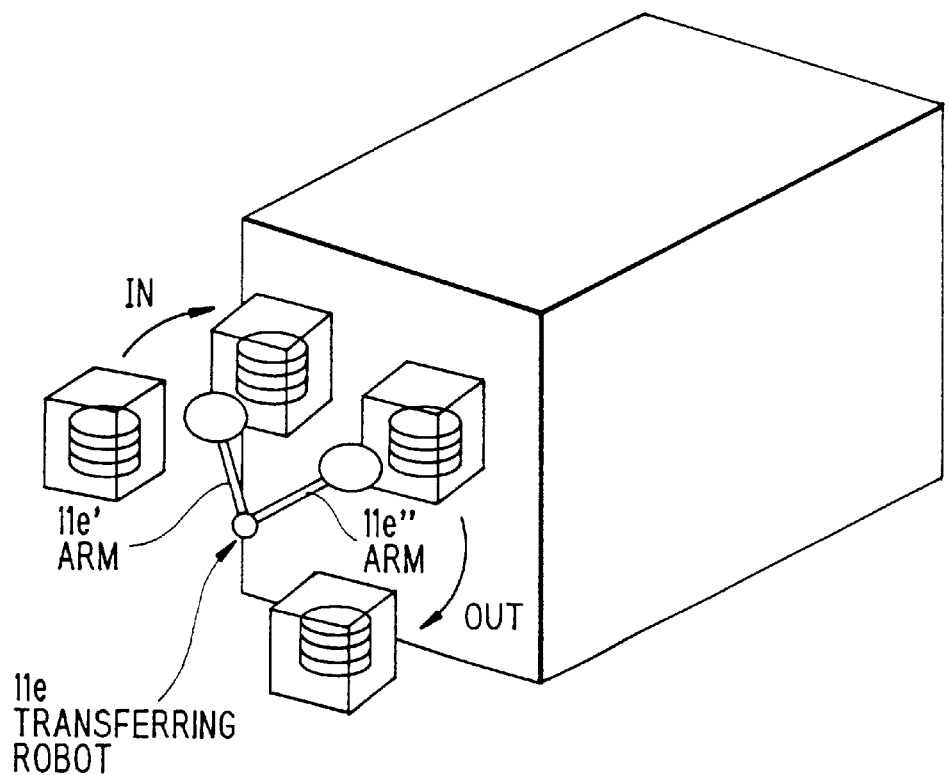
FIG. 9 is an illustration showing a wafer transfer mechanism in a third preferred embodiment according to the invention.

FIG. 9 is a perspective view showing a wafer transferring mechanism in the third preferred embodiment. In this embodiment, like the first embodiment in FIG. 7, the IN side is placed at the same side as the OUT side. As the wafer transferring mechanism 2, a single transferring robot 11e is used. The transferring robot 11e is provided with two arms 11e′ and 11e″. The arm 11e′ is used for IN to the isolation line 3, and the arm 11e″ is used for OUT from the isolation line 3. Thus, the IN side is placed at the same side as the OUT side.

FIG. 10 is a perspective view showing the details of the wafer transferring mechanism 2 using the relay wafer support 6 in the first embodiment in FIG. 7. With procedures (a)–(g) in FIG. 10, the wafers 5 are transferred from the mainstream-line cassette 4a to the isolation-line cassette 4b. First, in FIG. 10(a), the wafers 5 are loaded on the mainstream-line cassette 4a. in FIG. 10(b), the wafers 5 are pushed up by a wafer push-up 12 from beneath. The wafers 5 pushed up as shown in FIG. 10(c) are gripped by a wafer chuck 13, loaded on the relay wafer support 6 as shown in FIG. 10(d). Then, the wafers 5 are gripped by a wafer chuck 14 as shown in FIG. 10(e), put on a wafer support 15 of the isolation-line cassette 4b as shown in FIG. 10(f). Operating as described above, the wafers 5 can be loaded on the isolation-line cassette 4b. The relay wafer support 6 is provided to prevent the contamination due to the transferring robot, which is not shown in FIG. 10, used to transfer the wafers 5.

As explained above referring to FIGS. 5 to 10, for the isolation line 3 to prevent the contamination, "mainstream line-to-isolation line wafer transfer mechanism" is provided between the mainstream line 1 and the isolation line 3 so as not to take out the contaminant in the isolation line 3 into the mainstream line 1. The wafers 5 are transferred from the mainstream line 1 to the mainstream-line cassette 4a set at the loading side of "mainstream line-to-isolation line wafer transfer mechanism", further transferred from there to the isolation-line cassette 4b by the transferring robot 11. In this case, as described earlier, the transfer relay wafer support 6 can be used not to contaminate the mainstream-line cassette 4a through the transferring robot 11. The wafers 5 transferred to the isolation-line cassette 4b are transported by the carrier mechanism for the isolation line 3 to the target processing equipment, processed through the process such as film-forming and processing in the isolation line 3. In the equipment to conduct the film-covering or cleaning in the final-stage process, the wafers 5 are transferred to the mainstream-line cassette 4a. Thereafter, the isolation-line cassette 4b used since loaded into the equipment is returned to the wafer receiving port of the isolation line 3 on the side of "mainstream line-to-isolation line wafer transfer mechanism".

Also, the wafer taking-out side of the film-forming or cleaning equipment in the final-stage process is isolated completely from the isolation line 3, and is kept in as low contamination state as the mainstream line 1. The wafers 5 can be returned to the mainstream-line cassette 4a by connecting the wafer taking-out side directly with the wafer sending-out side to the mainstream line 1 or through a carrier with cleanness equal to that of the mainstream line 1, in "mainstream line-to-isolation line wafer transfer mechanism". Then, returning the wafers 5 to the mainstream line 1, the process is forwarded. Meanwhile, at any part or multiple parts of the wafer transfer process, the cassette may be cleaned.

Also, though the positional relationship between the mainstream line 1 and the isolation line 3 may be horizontal as described above, the wafers can be transferred by only using a simple transferring robot when the isolation line 3 is disposed below the mainstream line 1 to carry the wafers vertically.

Referring to FIGS. 11 to 16, the actual processing performed in the isolation line 3 is explained below. Numerals used in FIGS. 11 to 16 indicate the order of the processing.

Figure 11:
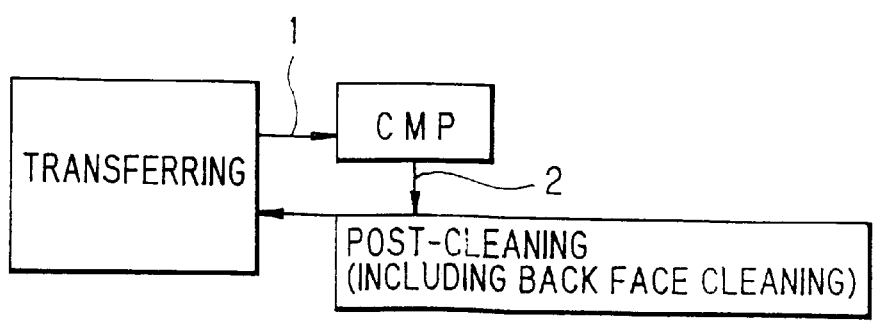
FIGS. 11 to 16 are process-flow block diagrams showing processes conducted actually in a isolation line of the semiconductor fabrication line according to the invention.

FIG. 11 shows an example that CMP equipment is used. A material targeted to CMP is interlayer dielectric film. Contamination desired to avoid is contamination by the material itself and slurry, and metal contamination (K, Na etc.) included in slurry solution. As shown, after the transferring of wafer, in the isolation line, CMP processing and post-cleaning (cleaning of back face) are conducted. Finally, the wafers are returned to the mainstream line.

Figure 12:
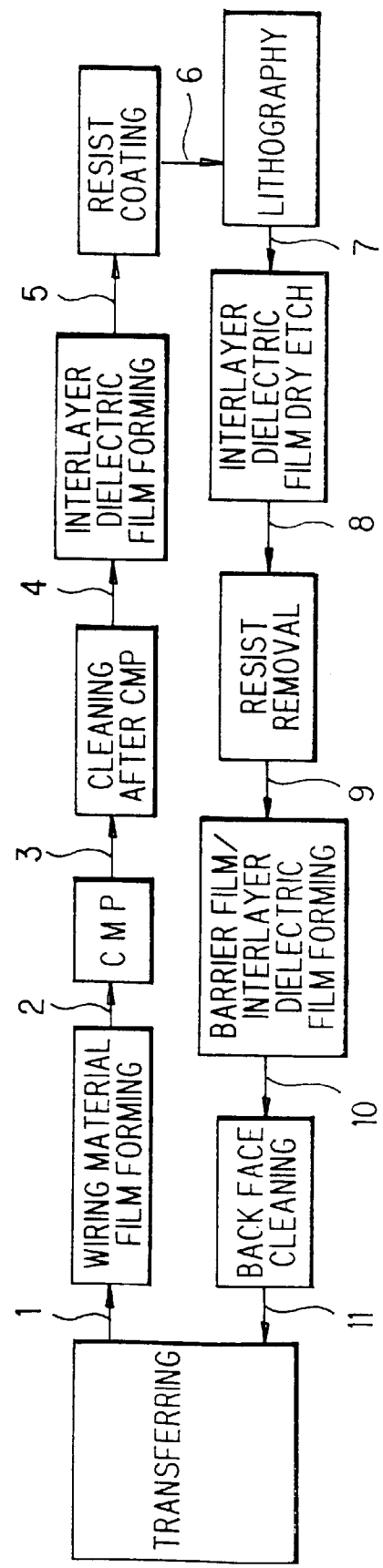

FIG. 12 also shows an example that CMP equipment is used. A material targeted to CMP is one used to metal wiring, e.g., Cu, Al, W etc. Contamination desired to avoid is contamination by the material itself and slurry, and metal contamination included in slurry solution. After the transferring of wafer, in the isolation line, film-forming of wiring material, CMP, cleaning after CMP, formation of interlayer dielectric film, resist coating, lithography, dry-etching of interlayer dielectric film, resist removal, formation of barrier film/interlayer dielectric film, and cleaning of back face are conducted. Finally, the wafers are returned to the mainstream line. The processed wafer may be returned from the cleaning after CMP to the block of the transferring.

Figure 13:
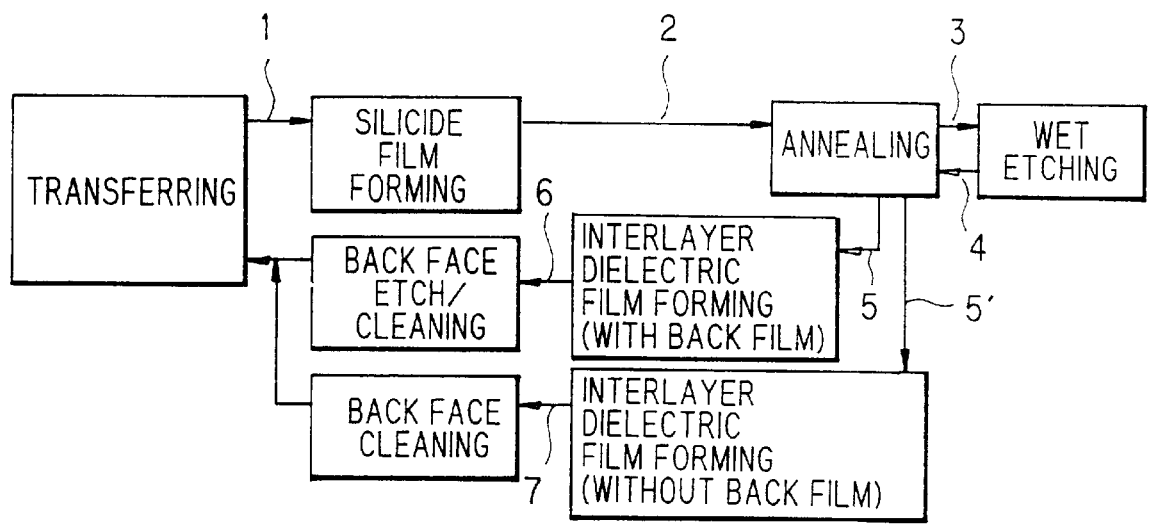

FIG. 13 shows an example that silicide wiring is formed. A silicide material used in Co, Ti, Ni. In this example, the isolation line has the individual lines for the respective materials. If the interaction of materials is little, the process can be in common use. After the transferring of wafer, formation of silicide film, annealing, wet etching, and annealing are conducted. Then, separating into back face etch and cleaning after formation of interlayer dielectric film (with back face) and back face cleaning after formation of interlayer dielectric film (without back face), finally the wafers are returned together to the mainstream line.

Figure 14:
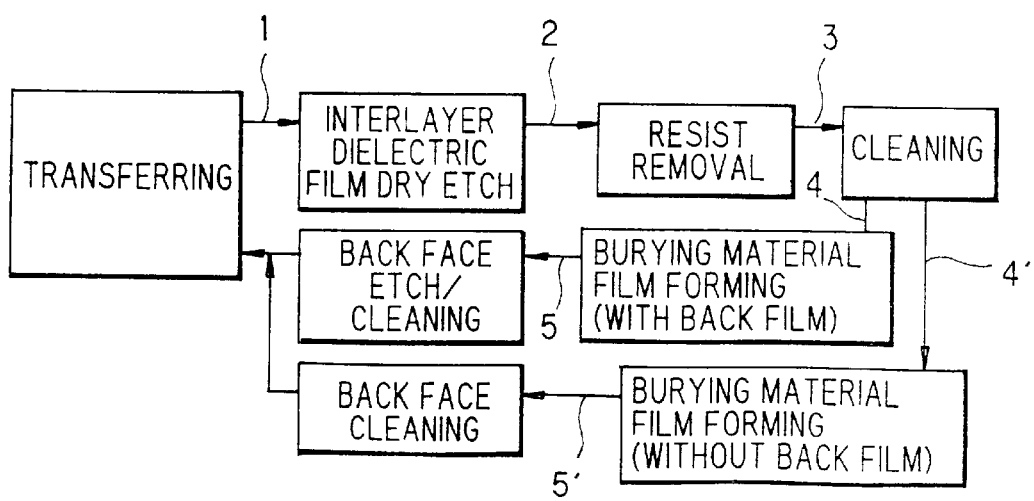

FIG. 14 shows an example that contact on silicide wiring is formed. A silicide material used is Co, Ti, Ni. After the transferring of wafer, dry etching of interlayer dielectric film, resist removal and cleaning are conducted. Then, separating into back face etch and cleaning after formation of burying material film (with back face) and back face cleaning after formation of burying material film (without back face), finally the wafers are returned together to the mainstream line.

Figure 15:
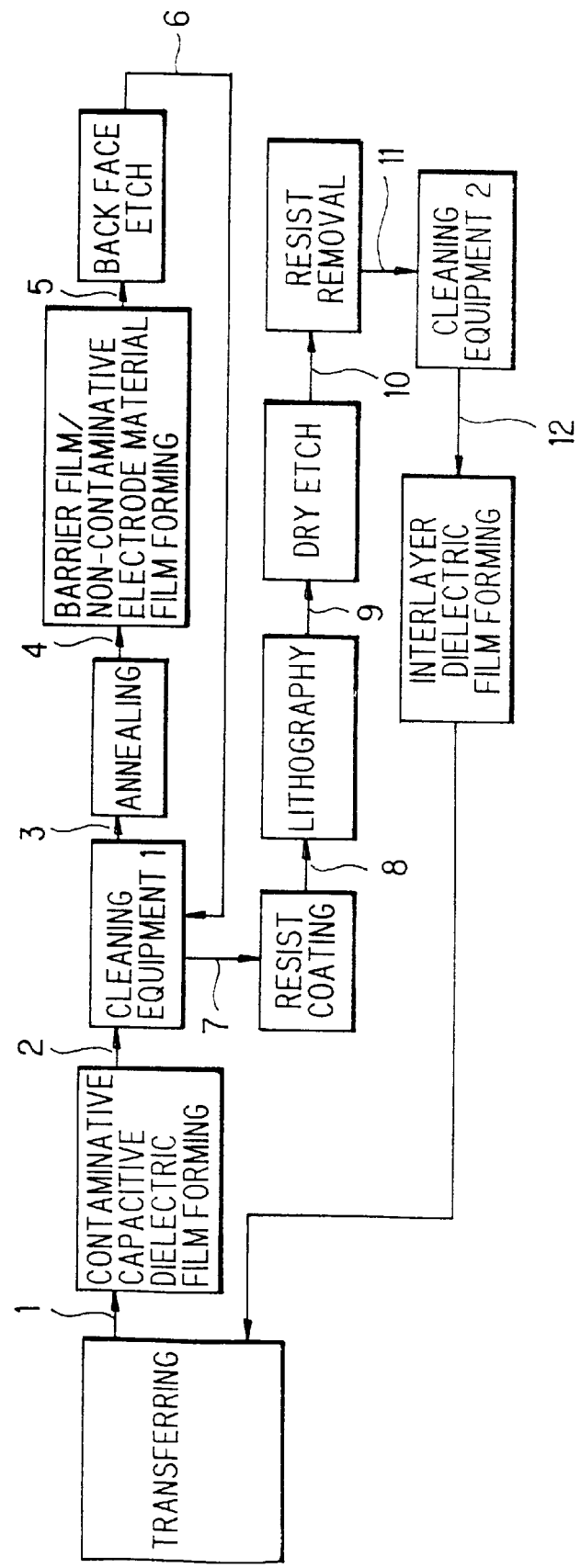
Figure 16:
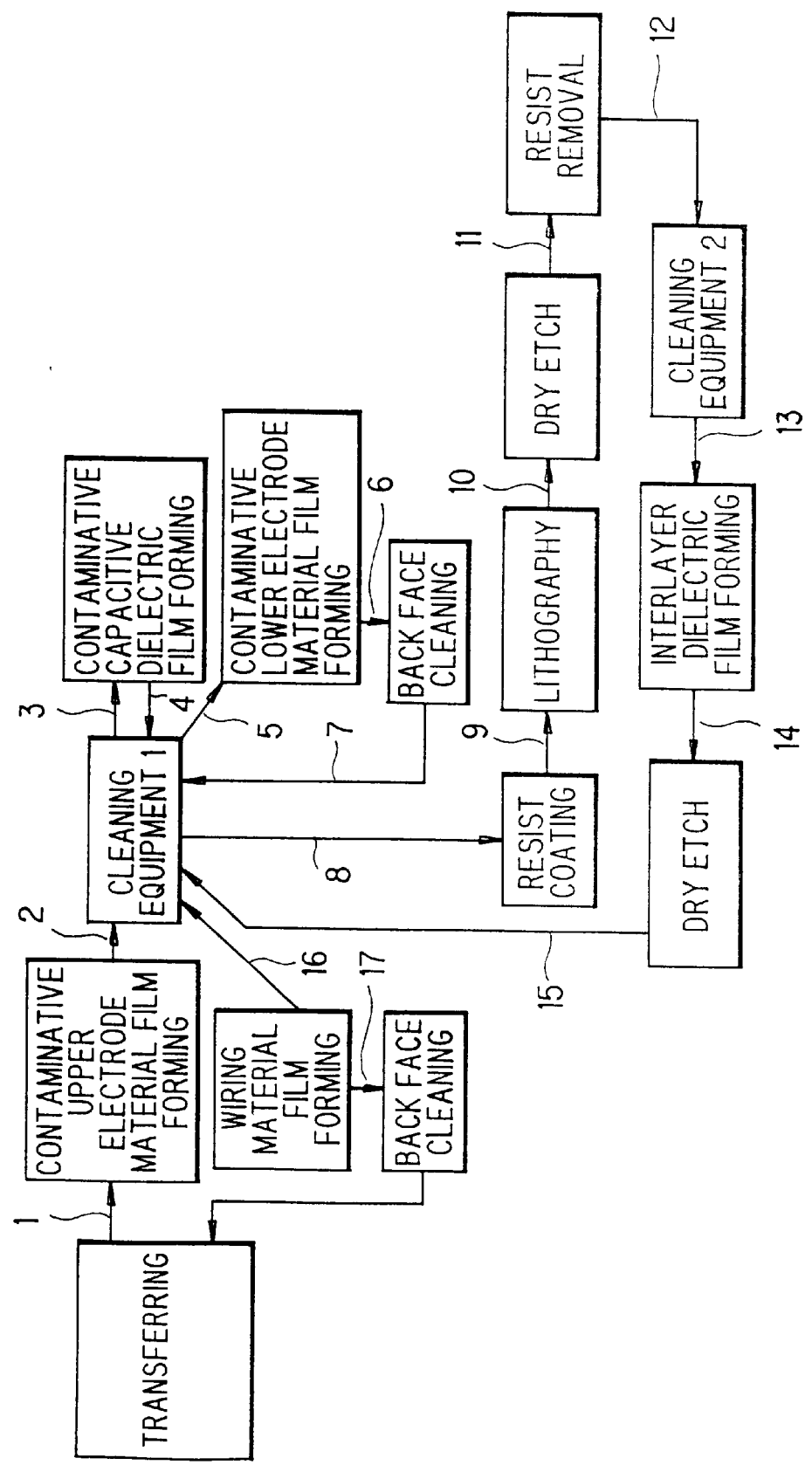

FIGS. 15 and 16 show examples of capacitor formation process. A capacitive dielectric material used for high permittivity film is Ta, BST (Ba, Sr, Ti), and a capacitive dielectric material used for ferroelectric film is PZT (Pb, Zr, Ti), SBT (Sr, Bi, Ta) etc. Also, an electrode material used is Ru, Pt, Ir, poly-Si etc.

FIG. 15 shows an example that electrode in capacitor formation process is of a non-contaminative material (poly-Si etc.). After the transferring of wafer, formation of contaminative capacitive dielectric film, cleaning (equipment 1), annealing, formation barrier film and non-contaminative electrode material film, etching of back face, cleaning, resist coating, lithography, dry etching, resist removal, cleaning (equipment 2) and formation of interlayer dielectric film are conducted. Finally, the wafers are returned to the mainstream line.

FIG. 16 shows an example that electrode in capacitor formation process is of a contaminative material (Ru, Pt, Ir etc.). After the transferring of wafer, formation of upper electrode material film, cleaning (equipment 1), formation of contaminative capacitive dielectric film, cleaning, formation of lower electrode material film, etching of back face, cleaning, resist coating, lithography, dry etching, resist removal, cleaning, formation of interlayer dielectric film, dry etching, cleaning, formation of wiring material film and cleaning of back face are conducted. Finally, the wafers are returned to the mainstream line.

Advantages of Invention:

In this invention, the film-formation and processing of contamination causing material is conducted in the isolation line and after processing, the contamination causing material appearing on the wafer surface is covered with film, optionally further cleaning, then the wafers are returned to the mainstream line. Therefore, the contamination causing material does not contaminate a wafer processed in another process in the mainstream line, therefore the contamination can be prevented. Thus, a material that is used to fabricate a semiconductor device and may influence badly another part of the semiconductor device can be prevented completely and simply from being the contaminant to the semiconductor device in the semiconductor fabrication line. So, the excessive equipment investment can be avoided.

Also, this invention provides the wafer transfer mechanism between the mainstream line and the isolation line to avoid the propagation of contamination, for the semiconductor fabrication line with contamination causing material isolation line. Namely, since the process relating to the contamination causing material is conducted in the isolation line, the isolation line except the processes of film-covering and cleaning in the final stage is not required of any special consideration about the concerned contamination causing material. So, for example, the contamination through carrier can be prevented easily and simply.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor fabrication line for fabricating a semiconductor device, comprising:

a mainstream line for conducting a semiconductor fabrication process to fabricate said semiconductor device; and an isolation line disposed separately from said mainstream line in said semiconductor fabrication line, wherein said isolation line is provided for a contamination-including semiconductor fabrication process, such that a contamination causing material for contaminating said mainstream line and appearing on a surface of a wafer, after processing is eliminated from the surface of the wafer in said isolation line, and the wafer is returned from said isolation line to said mainstream line.

2. The semiconductor fabrication line, according to claim 1, wherein said isolation line includes an individual line to process individually said contamination causing material and a common line to process in a lump said contamination causing material.

3. The A semiconductor fabrication line, according to claim 1, wherein said contamination-including semiconductor fabrication process includes processes of film-forming, processing, film-covering and cleaning.

4. A semiconductor fabrication line, according to claim 3, wherein:

said film-forming and processing processes are conducted in said individual line.

5. The semiconductor fabrication line, according to claim 3, wherein said film-covering and cleaning processes are conducted in said common line.

6. The semiconductor fabrication line, according to claim 1, wherein said mainstream line uses a mainstream-line cassette to load said wafer and said isolation line uses an isolation-line cassette to load said wafer.

7. The semiconductor fabrication line, according to claim 6, wherein said wafer is transferred between said mainstream-line cassette and said isolation-line cassette by a transferring robot with an arm.

8. The semiconductor fabrication line, according to claim 6, wherein a relay wafer support to load said wafer is disposed between said mainstream-line cassette and said isolation-line cassette so an not to contaminate said mainstream-line cassette through said transferring robot.

9. The semiconductor fabrication line, according to claim 8, wherein said wafer is transferred between said mainstream-line cassette and said relay wafer support by a first transferring robot with an arm, and said wafer is transferred between said relay wafer support and said isolation-line cassette by a second transferring robot with an arm.

10. The semiconductor fabrication line according to claim 1, wherein said isolation line is disposed horizontally to said mainstream line.

11. The semiconductor fabrication line, according to claim 1, wherein said isolation line is disposed vertically to said mainstream line.

12. A wafer transfer mechanism for carrying a wafer in a semiconductor fabrication process, comprising:

a before-processing cassette that is used before processing the wafer; and an after-processing cassette that is used after processing the wafer, said before-processing cassette and said after-processing cassette being separate from one another.

13. The wafer transfer mechanism, according to claim 12, further comprising:

a transferring robot with an arm that transfers the wafer between said before-processing cassette and said after-processing cassette.

14. The wafer transfer mechanism, according to claim 12, further comprising:

a relay wafer support disposed between said before-processing cassette and said after-processing cassette, wherein said wafer is loaded temporarily on said relay wafer support when transferring said wafer between said before-processing cassette and said after-processing cassette.

15. The wafer transfer mechanism, according to claim 14, further comprising:

a first transferring robot with an arm that transfers the wafer between laid before-processing cassette and said relay wafer support; and a second transferring robot with an arm that transfers the wafer between said relay wafer support and after-processing cassette.

16. A semiconductor fabrication line for fabricating a semiconductor device, comprising:

a mainstream line for conducting a semiconductor fabrication process to fabricate said semiconductor device; and means for isolating a contamination-including semiconductor fabrication process, wherein said isolating means is disposed separately from said mainstream line in said semiconductor fabrication line, wherein a contamination causing material appearing on a surface of a wafer during said contamination-including process is eliminated in the isolating means, wherein after said contamination-including process said contamination causing material is eliminated from the surface of said wafer in said isolating means, said wafer is transferred from said isolating means to said mainstream line.

17. The semiconductor fabrication line, according to claim 16, wherein said isolating means includes an individual line to process individually said contamination causing material and a common line to process in a lump said contamination causing material.

18. The semiconductor fabrication line, according to claim 16, wherein said contamination-including semiconductor fabrication process includes processes of film-forming, processing, film-covering and cleaning.

19. The semiconductor fabrication line, according to claim 18, wherein said film-covering and cleaning processes are conducted in said common line.

20. The semiconductor fabrication line, according to claim 16, wherein said mainstream line uses a mainstream-line cassette to load said wafer and said isolating means uses an isolation-line cassette to load said wafer.

* * * * *